(12) United States Patent
Tam

(10) Patent No.: US 9,088,705 B1
(45) Date of Patent: Jul. 21, 2015

(54) CAMERA MODULE PACKAGE WITH STIFFENER-MOUNTED IMAGE SENSOR DIE

(71) Applicant: Amazon Technologies, Inc., Reno, NV (US)

(72) Inventor: Samuel Waising Tam, Daly City, CA (US)

(73) Assignee: Amazon Technologies, Inc., Reno, NV (US)

( * ) Notice: Subject to any disclaimer, the term of this patent is extended or adjusted under 35 U.S.C. 154(b) by 34 days.

(21) Appl. No.: 14/109,524

(22) Filed: Dec. 17, 2013

Related U.S. Application Data

(60) Provisional application No. 61/872,475, filed on Aug. 30, 2013.

(51) Int. Cl.
*H04N 5/225* (2006.01)
*H01L 27/146* (2006.01)

(52) U.S. Cl.
CPC .......... *H04N 5/2253* (2013.01); *H01L 27/1469* (2013.01)

(58) Field of Classification Search
CPC ........................... H04N 5/2254; H04N 5/2257
USPC ............. 348/207.99, 335, 340, 65; 250/252.1
See application file for complete search history.

(56) References Cited

U.S. PATENT DOCUMENTS

| | | | |
|---|---|---|---|
| 7,230,777 B2 | 6/2007 | Ye | |
| 7,525,096 B2 | 4/2009 | Nakajo et al. | |
| 7,555,211 B2 | 6/2009 | Go | |
| 7,570,297 B2 | 8/2009 | Maeda et al. | |
| 7,633,543 B2 | 12/2009 | Shinomiya | |
| 7,884,875 B2 | 2/2011 | Kwon et al. | |
| 7,948,555 B2 | 5/2011 | Kwon et al. | |
| 8,009,971 B2 | 8/2011 | Koo et al. | |
| 8,089,694 B2 | 1/2012 | Wernersson | |
| 8,092,102 B2 | 1/2012 | Shangguan et al. | |
| 8,149,321 B2 | 4/2012 | Ryu et al. | |
| 8,170,408 B2 | 5/2012 | Nasiri et al. | |
| 8,174,583 B2 | 5/2012 | Ko et al. | |
| 8,223,249 B2 | 7/2012 | Chang | |
| 8,248,514 B1 | 8/2012 | Chang | |
| 8,248,523 B2 | 8/2012 | Chua et al. | |
| 8,405,756 B2 | 3/2013 | Yano et al. | |
| 8,430,579 B2 | 4/2013 | Tam et al. | |
| 2002/0167081 A1 | 11/2002 | Kondo | |
| 2004/0115866 A1 | 6/2004 | Bang et al. | |
| 2004/0212719 A1 | 10/2004 | Ikeda | |

(Continued)

FOREIGN PATENT DOCUMENTS

WO   WO2012038703 A2   3/2012

OTHER PUBLICATIONS

Non-Final Office Action dated Jan. 30, 2015 in U.S. Appl. No. 14/109,502, filed Dec. 17, 2013.

(Continued)

*Primary Examiner* — Tuan Ho
(74) *Attorney, Agent, or Firm* — K&L Gates LLP

(57) ABSTRACT

Systems and methods of manufacturing compact camera modules for use in electronic device are provided. The camera module includes a flexible tape substrate having an image sensor die wire bonded to an upper side of the substrate and a rigid stiffener formed on the lower side of the tape substrate. A spacer member supports an optical filter above the image sensor die and the bond wires.

20 Claims, 11 Drawing Sheets

(56) References Cited

U.S. PATENT DOCUMENTS

| | | |
|---|---|---|
| 2005/0024752 A1 | 2/2005 | Webster |
| 2008/0170141 A1 | 7/2008 | Tam et al. |
| 2008/0252771 A1 | 10/2008 | Wu |
| 2009/0190025 A1 | 7/2009 | Lu |
| 2010/0053423 A1 | 3/2010 | Singh |
| 2011/0075999 A1 | 3/2011 | Chiu |
| 2011/0102667 A1 | 5/2011 | Chua et al. |
| 2011/0122267 A1 | 5/2011 | Ahn et al. |
| 2011/0150462 A1 | 6/2011 | Chiu et al. |
| 2011/0194014 A1 | 8/2011 | Ozaki |
| 2011/0194023 A1 | 8/2011 | Tam et al. |
| 2011/0262121 A1 | 10/2011 | Yanagisawa et al. |
| 2011/0267535 A1 | 11/2011 | Seo et al. |
| 2012/0242883 A1 | 9/2012 | Pavithran et al. |
| 2012/0276951 A1 | 11/2012 | Webster et al. |
| 2012/0312976 A1* | 12/2012 | Boulanger et al. ......... 250/252.1 |
| 2013/0050571 A1 | 2/2013 | Tam |
| 2013/0107068 A1 | 5/2013 | Kim et al. |
| 2013/0128106 A1 | 5/2013 | Tam et al. |

OTHER PUBLICATIONS

Non-Final Office Action dated Mar. 17, 2015 in U.S. Appl. No. 14/109,491, filed Dec. 17, 2013.

Chowdhury, et al., "Challenges of Megapixel Camera Module Assembly and Test" Proceedings of 2005 Electronic Components and Technology Conference, pp. 1390-1401.

\* cited by examiner

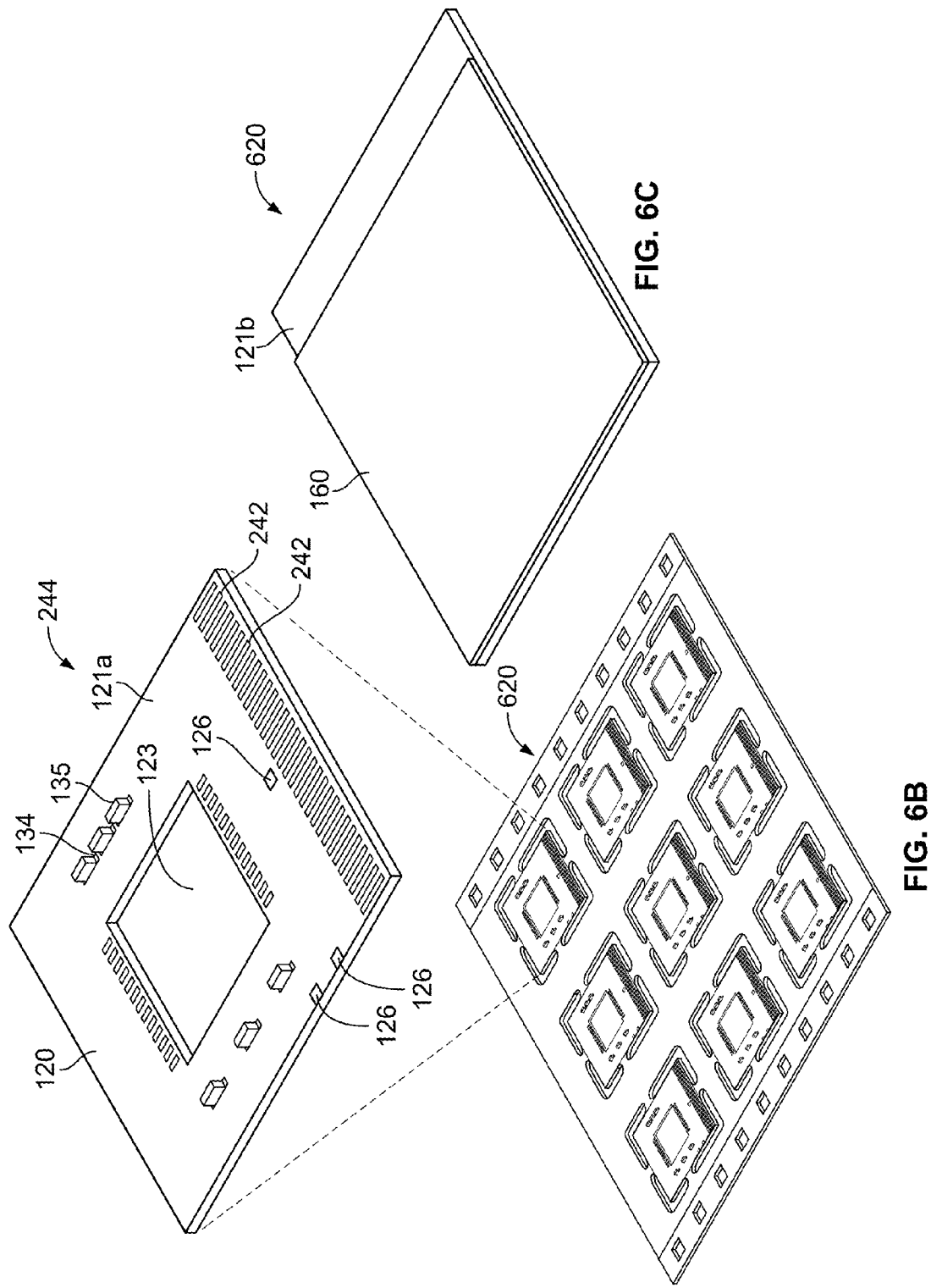

CAMERA MODULE PACKAGE WITH STIFFENER-MOUNTED IMAGE SENSOR DIE

CROSS-REFERENCE TO RELATED APPLICATIONS

This application claims the benefit of U.S. Provisional Application No. 61/872,475, filed Aug. 30, 2013, the disclosure of which is incorporated herein by reference in its entirety.

BACKGROUND

Digital camera functionality is being incorporated into a wide variety of electronic devices. In particular, there is an increased demand by consumers for high quality photographic capability in consumer electronics and mobile computing devices, such as mobile phones, smartphones, and tablet computers. However, there is also high demand for mobile computing devices with increasingly small form factors, with extremely thin devices being particularly desirable for both aesthetics and portability. In addition, there is an ongoing desire to improve quality and functionality while decreasing the cost of components and manufacturing.

Accordingly, there is a need for improved camera module designs and manufacturing processes for incorporation into electronic devices.

BRIEF DESCRIPTION OF DRAWINGS

FIGS. 6A-6I illustrate various steps in the manufacturing process illustrated in FIG. 5.

DETAILED DESCRIPTION

In the following description, reference is made to the accompanying drawings which illustrate several embodiments of the present invention. It is understood that other embodiments may be utilized, and mechanical, compositional, structural, and electrical operational changes may be made without departing from the spirit and scope of the present disclosure. The following detailed description is not to be taken in a limiting sense, and the scope of the embodiments of the present invention is defined only by the claims of the issued patent.

Systems and methods in accordance with various embodiments of the present disclosure provide improved manufacturing methods and camera module designs that are compact, inexpensive to manufacture, and reliable in operation. These designs may provide small form factor autofocus (AF) camera modules for incorporation into thin mobile devices, such as tablets or smartphones. In accordance with some embodiments, the camera module utilizes a flexible tape substrate coupled to a rigid stiffener member. An image sensor die is positioned in an opening in the tape substrate and bonded to the stiffener member such that the upper surface of the image sensor die is approximately level with the upper surface of the tape substrate. The image sensor die is wire bonded to the tape substrate. An optical filter is coupled to a spacer member provided on the upper surface of the tape substrate. The spacer member supports the optical filter so as to prevent undesirable contact between the optical filter and the bond wires coupling the image sensor die to the tape substrate. A lens module is mounted to the upper surface of the tape substrate, enclosing the optical filter, spacer member, image sensor die, and other passive components surface-mounted to the tape substrate. The resulting camera module can achieve a compact footprint with low manufacturing costs.

Figure 1:
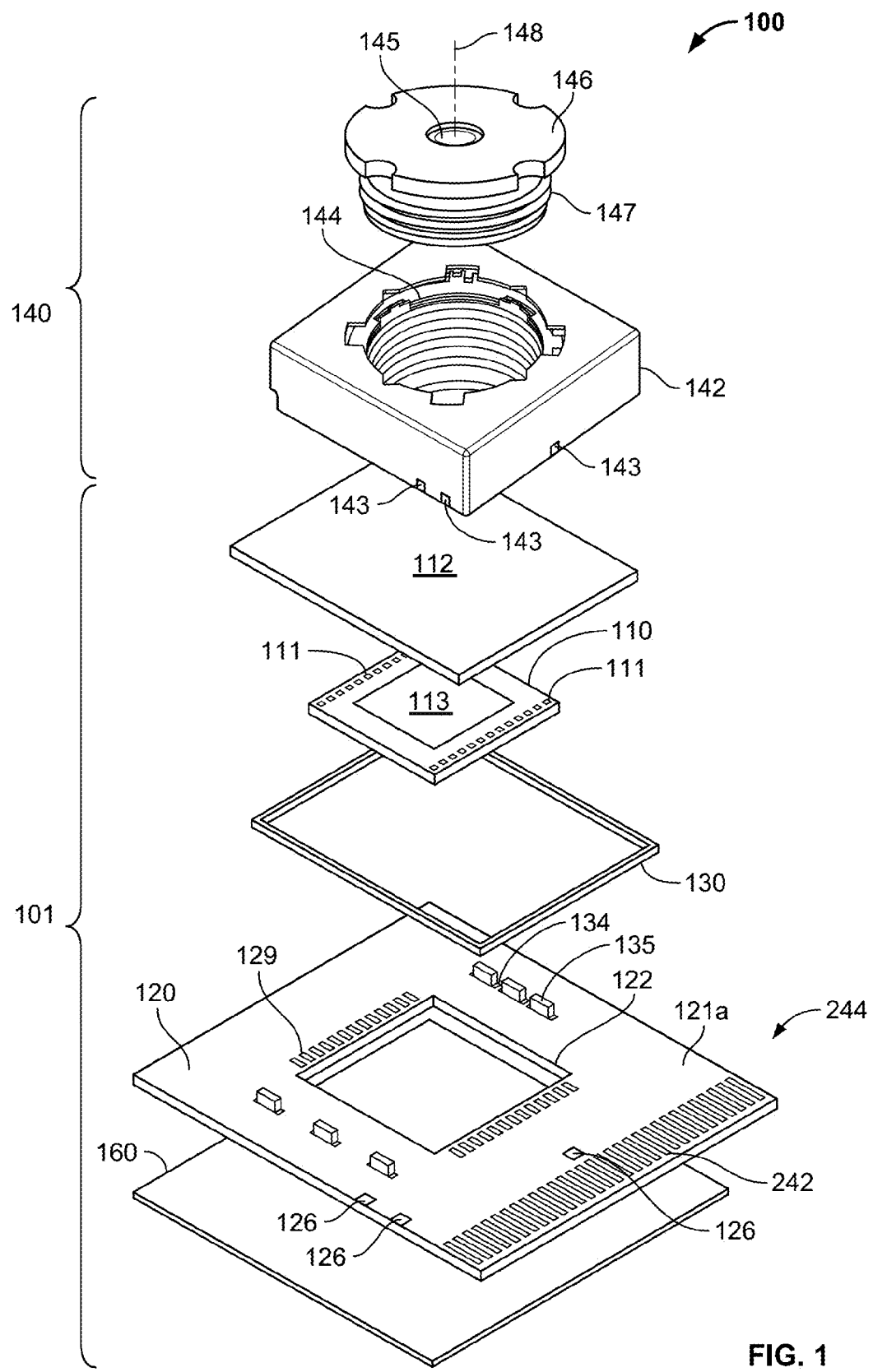
FIG. 1 is an exploded perspective view of a camera module with an image sensor die positioned on a stiffener member in a substrate cavity, in accordance with embodiments of the present invention.
Figure 4:
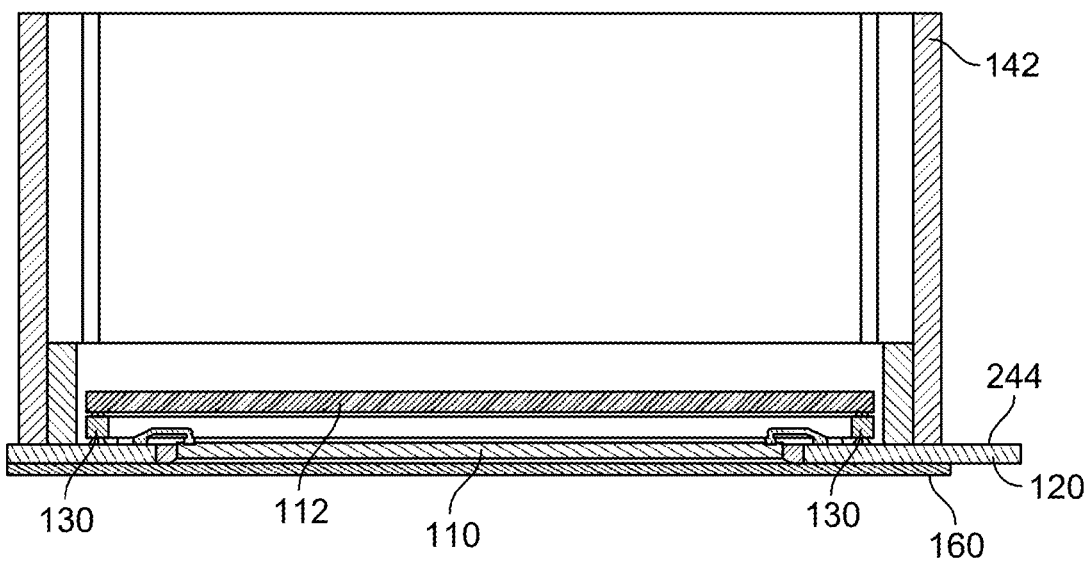
FIG. 4 is a cross-sectional view of a camera module, in accordance with embodiments of the present invention.

FIG. 1 is an exploded perspective view of a camera module 100 with an image sensor die positioned on a stiffener member in a substrate cavity, in accordance with embodiments of the present invention. FIG. 4 is a cross-sectional view of the camera module 100.

The camera module 100 comprises an image sensor module 101 and a lens module 140. The image sensor module 101 comprises an image sensor 110, an optical filter 112, a substrate 120, and electronic components 135.

The lens module 140 comprises an autofocus lens housing 142 forming a cavity containing one or more lenses 145 which are supported by a lens barrel 146. The lens barrel 146 includes a threaded section 147 and is received in a corresponding lens barrel 144, which is driven by motors or actuators in the lens housing 120 to rotate, thereby translating the lens barrel 146 up and down along optical axis 148. The lens module 140 may utilize voice coil motors (VCM) to move the lens barrel 146 along the optical axis of the camera. Alternatively, microelectromechanical systems (MEMS) actuators may be used to translate the lenses 145. A variety of camera modules, including a variety of multi-lens autofocus camera modules, are commercially available and may be utilized in accordance with various embodiments of the present invention.

The substrate 120 may comprise any form of circuit substrate suitable to provide the necessary interconnection structure for operation of the camera module 100, as is well known in the art. The substrate 120 may comprise, for example, a flexible substrate, such as a flexible high-density interconnect (HDI) tape substrate, which is available in very thin configurations. The HDI tape substrate may comprise a multilayer interconnect structure using polyimide as a dielectric and electroplated copper conductor lines. The flexible substrate 120 may comprise a flexible base material comprising, e.g., polyester, polyimide, polyethylene napthalate, or polyetherimide, and conductive layers comprising, e.g., conductive metal foil, electroplated copper, screen printing metal circuits, or other conductive materials.

A stiffener member 160 is coupled to a lower surface of the flexible substrate 120 opposite the lens module 140. The flexible substrate 120 includes an image sensor opening 122, which exposes a portion of the stiffener member 160. The image sensor die 110 is positioned in the image sensor opening 122 and coupled to the exposed portion of the stiffener member 160.

In some embodiments, the upper surface of the image sensor die 110 is approximately coplanar with an upper surface of the flexible substrate 120. The thickness of a flexible tape substrate 120 having a suitable interconnect structure may be, for example, approximately 0.16 mm, 0.18 mm, or 0.20 mm. The image sensor die 110 may have a thickness of approximately 0.185 mm, and be attached to the stiffener member 160 using an epoxy adhesive layer having a thickness of approximately 0.03 mm. Alternatively, substrate 720 may comprise a BT/FR4 laminate substrate, which may have a thickness of approximately 0.3 mm-0.4 mm.

The upper surface of the flexible substrate 120 includes a plurality of substrate-sensor contacts 129. The image sensor die 110 includes a plurality of output die contacts 111 formed along one or more edges of the image sensor die 110. The output die contacts 111 are coupled to the substrate-sensor contacts 129, as will be described in greater detail below.

In the illustrated embodiment, the upper side 121a of the substrate 120 includes a plurality of component contacts 134 for coupling with the electronic components 135. The electronic components 135 may include passive and/or active components for processing the output signals from the image sensor. The passive components may include inductors, capacitors, or resistors. The electronic components 135 are coupled to the component contacts 134 formed on the substrate 120, thereby electrically coupling the passive components 135 with the image sensor die 110 via the substrate-sensor contacts 129.

The upper side 121a of the flexible substrate 120 further includes a main board contact region 244, which may extend beyond the stiffener member 160. The main board contact region includes a plurality of land grid array (LGA) pads 242 which may be coupled to main board contacts on the main board of the electronic device. The LGA pads 242 receive all of the power and I/O signals required for operation of the camera module 100. The LGA pads 242 can be bonded (e.g., soldered) directly to corresponding contacts on the main board, coupled to an LGA socket mounted to the main board, or coupled to another intermediate interposer structure, such as a cable or circuit board, which is coupled to the main board.

The image sensor die 110 includes a photosensor portion 113 comprising any type of image capturing element that converts an optical image into an electronic signal, such as, e.g., a charge-coupled device (CCD) or complementary metal-oxide-semiconductor (CMOS) active pixel sensor.

An optical filter 112 may be used to improve the quality of the images generated by the camera module. The optical filter may be used for filtering undesirable wavelengths of light, such as infrared light, received by the lens module 140 to prevent the light from reaching the photosensor portion 113 of the image sensor die 110, which could degrade the quality of digital image generated. In other embodiments, other types of optical filters may be used, such as, for example, a blue or other color filter, or a polarizing filter. A spacer member 130 is coupled to the upper side 121a of the flexible substrate 120 surrounding the image sensor die 110. The spacer member 130 supports the optical filter 112 above the image sensor die 110 and bond wires 128 coupling the image sensor die 110 to the flexible substrate 120, as will be described in greater detail below.

Figures 2A, 2B:
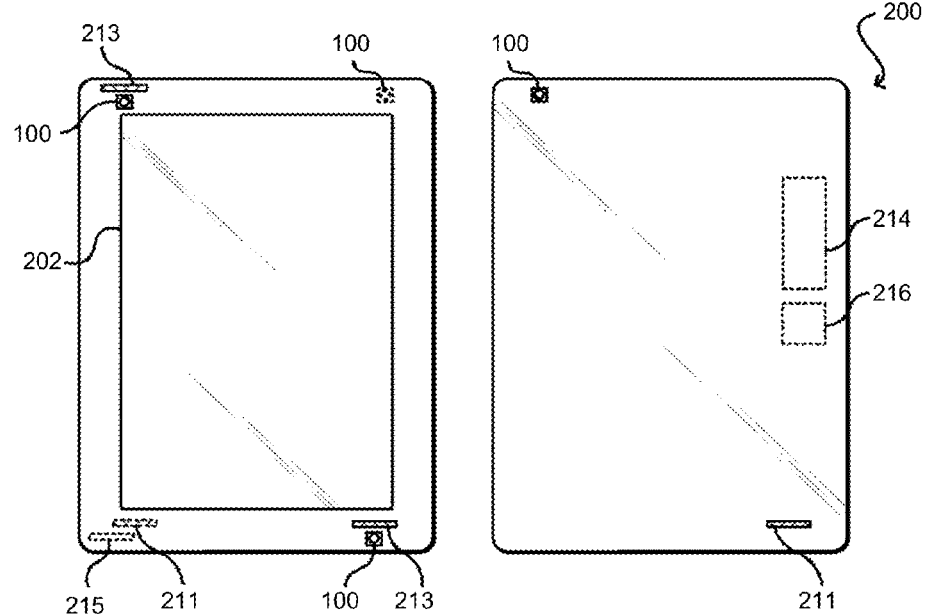
FIGS. 2A-2B illustrate front and back views, respectively, of an example portable computing device that may incorporate a camera module in accordance with embodiments of the present invention.

The camera module 100 may be incorporated into any of a variety of electronic devices. FIGS. 2A-2B illustrate front and back views, respectively, of an example portable computing device 200 that may incorporate a camera module in accordance with various embodiments described herein. Although one example of an electronic device is shown, it should be understood that various other types of electronic devices that are capable of incorporating digital camera functionality can be used in accordance with various embodiments discussed herein. The electronic devices can include, for example, smartphones, electronic book readers, tablet computers, notebook computers, personal data assistants, cellular phones, video gaming consoles or controllers, television set top boxes, and portable media players, among others.

In this example, the portable computing device 200 has a display 202 (e.g., a liquid crystal display (LCD) element) operable to display image content to one or more users or viewers of the device. In at least some embodiments, the display screen provides for touch or swipe-based input using, for example, capacitive or resistive touch technology.

Figure 3:
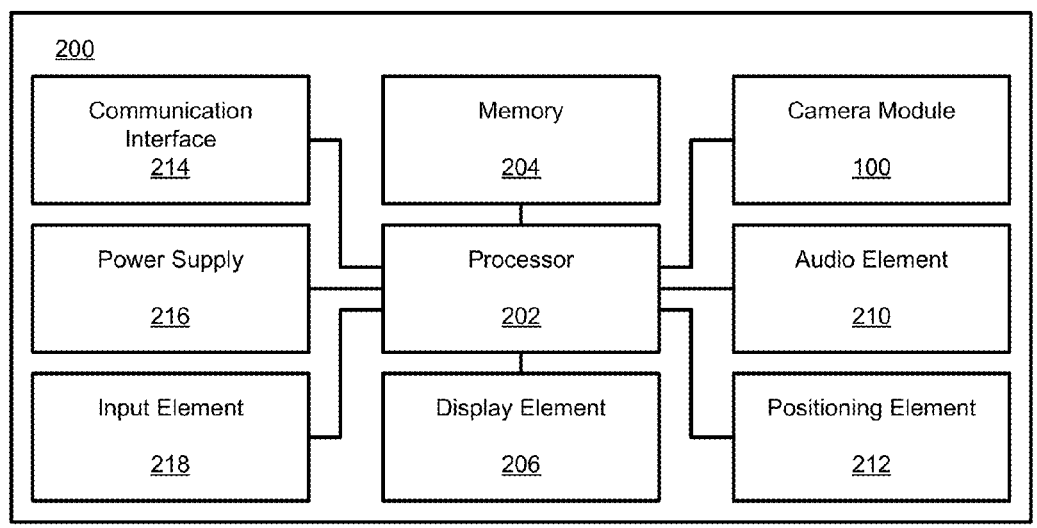
FIG. 3 is an example block diagram illustrating basic components of a computing device, in accordance with embodiments of the present invention.

FIG. 3 is an example block diagram illustrating basic components of a computing device, such as computing device 200. In this example, the device 200 includes at least one processor 202 for executing instructions that can be stored in at least one memory device 204. As would be apparent to one of ordinary skill in the art, the memory device 204 can include one or more different types of memory, data storage or computer-readable storage media, such as, for example, a first data storage for program instructions for execution by the processor 202, a second data storage for images or data and/or a removable storage for transferring data to other devices.

The computing device 200 includes one or more camera modules 100 configured to capture an image of people or objects in the vicinity of the device 200. The computing device 200 may include a main board, which may be the primary circuit board for the computing device 200 onto which one or more of the following components may be mounted. The camera module 100 includes a circuit substrate 120 which may be electrically coupled to the main board of the computing device 200 in a variety of ways, such as by direct mounting to the main board or with an interposer, which serves as an intermediate coupling device providing an electrical interface between the circuit substrate 120 and the main board. The interposer may comprise, for example, a cable or a rigid or flexible circuit board having interfaces coupled to the circuit substrate 120 and the main board, as will be described in greater detail below.

The computing device 200 includes a display element 206 for displaying images using technologies such as, for example, electronic ink (e-ink), organic light emitting diode (OLED) or liquid crystal display (LCD). The computing device 200 may also include an audio element 210, such as one or more audio speakers 211 and/or audio capture elements capable of capturing audio data, such as microphones 213. The computing device 100 may also include a positioning element 212, such as motion, position or orientation determining element 215, that provides information such as a position, direction, motion, or orientation of the device 200. The computing device 200 can include one or more input elements 218 operable to receive inputs from a user. The input elements 218 can include, for example, a push button, touch pad, touch screen, wheel, joystick, keyboard, mouse, trackball, keypad or any other such device or element whereby a user can provide inputs to the computing device 200. The computing device 200 may also include at least one communication interface 214, comprising one or more wireless components operable to communicate with one or more separate devices within a communication range of the particular wireless protocol. The wireless protocol can be any appropriate protocol used to enable devices to communicate wirelessly, such as Bluetooth, cellular, or IEEE 802.11. It should be understood that the computing device 200 may also include one or more wired communications interfaces for coupling and communicating with other devices. The computing device 200 may also include a power supply 216, such as, for example, a rechargeable battery operable to be recharged through conventional plug-in approaches, or through other approaches such as capacitive charging.

Figure 5:
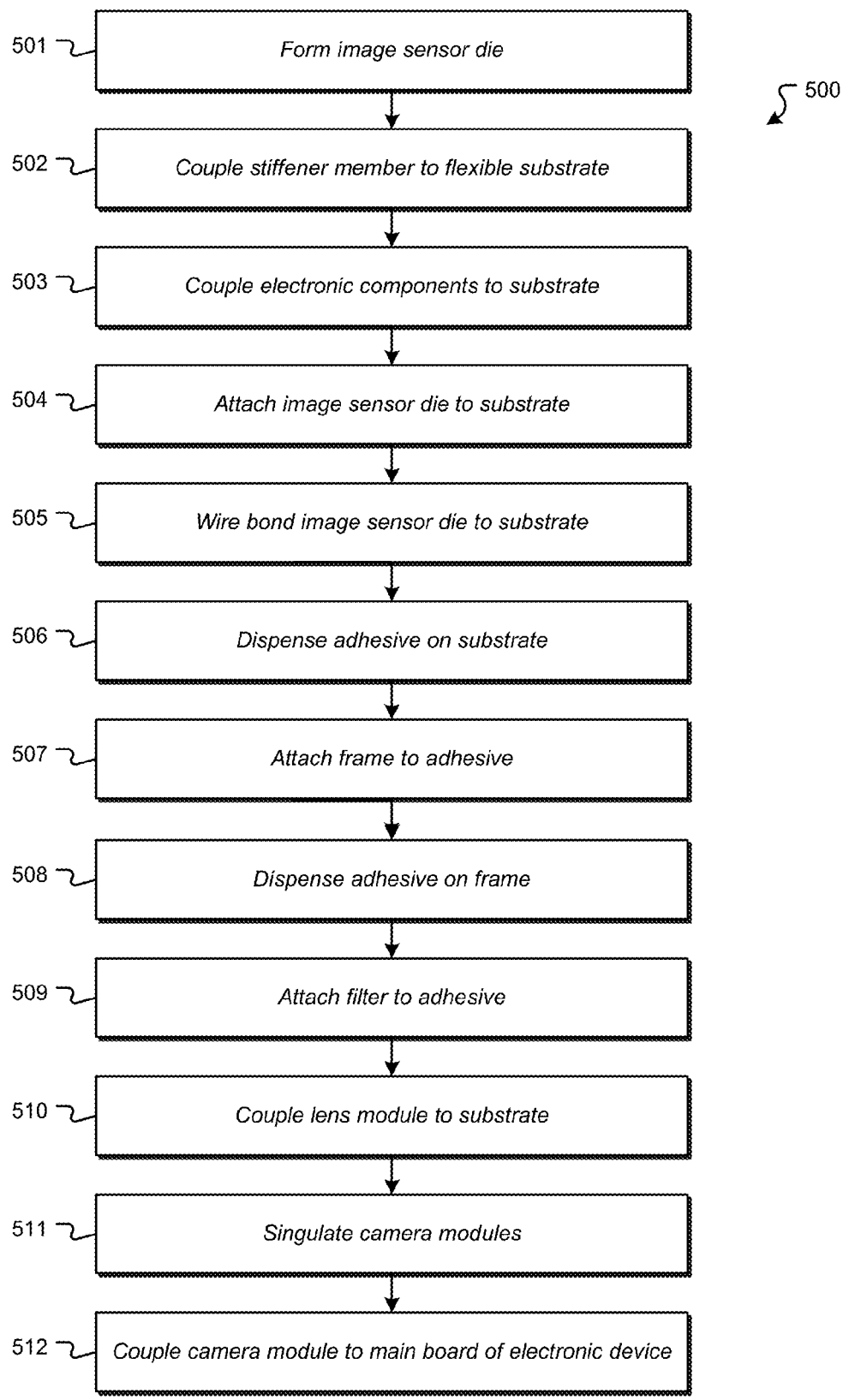
FIG. 5 is a flowchart illustrating a method of manufacturing a camera assembly with an image sensor die positioned on a stiffener member in a substrate cavity, in accordance with embodiments of the present invention.

FIG. 5 is a flowchart illustrating a method 500 of manufacturing a camera assembly 100 with an image sensor die 110 coupled to a stiffener member 160 in a cavity within the flexible substrate 120, in accordance with embodiments of the present invention. FIGS. 6A-6I illustrate various steps in the manufacturing method 500.

Figure 6A:
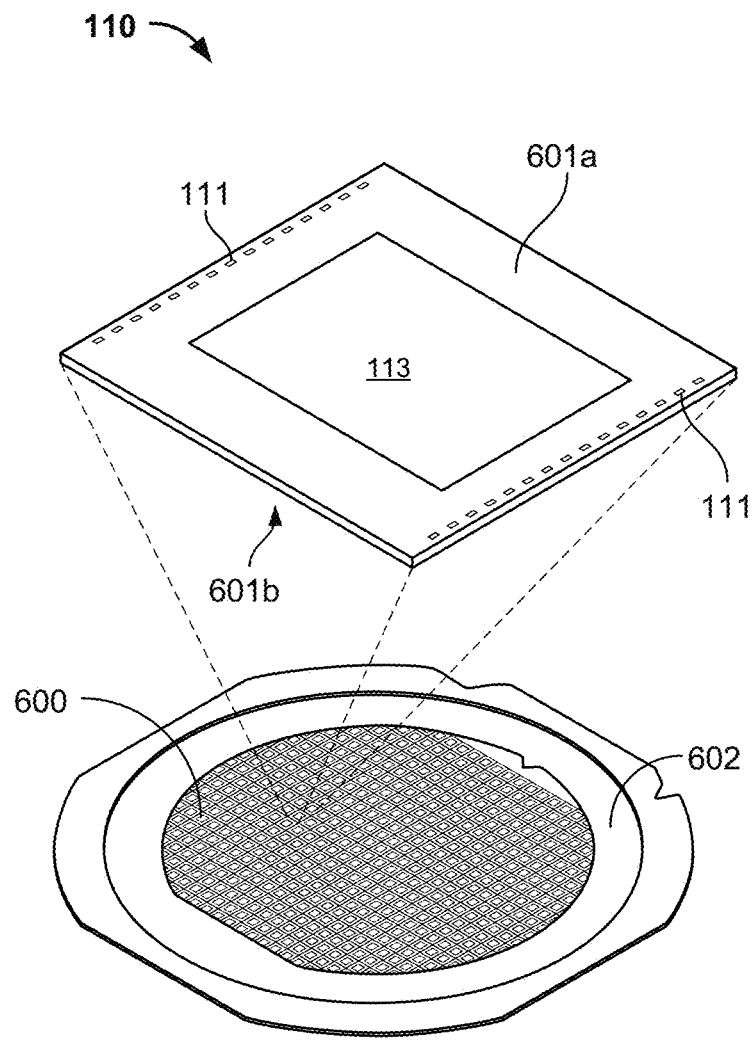

In step 501, shown in FIG. 6A, the image sensor die 110 is formed. Before each image sensor die 110 is singulated or diced from the wafer 600 held in the wafer carrier 602, a plurality of die contacts 111 are formed on the upper surface 601a of each image sensor die 110. The die contacts 111 can be formed in a variety of ways, depending on the desired method of coupling the image sensor die 110 to the substrate 120. In some embodiments, the die contacts 111 on the image sensor die 110 may be used for wire bonding with the substrate 120. The die contacts 111 may be formed using any of a variety of well-known techniques, such as, for example, using ball bonds.

In step 502, shown in FIGS. 6B-6C, a plurality of substrates 120 are provided in a substrate strip array 620, and a stiffener member 160 is coupled to each of the flexible substrates 120 in the array 620. FIG. 6B shows the upper side 121a of each substrate 120, and FIG. 6C shows the lower side 121b of each substrate 120. The upper side 121a of the substrate 120 includes a main board contact region comprising a plurality of main board contacts 142.

The upper side 121a of each substrate 120 further includes a plurality of component contacts 134 around the periphery of the image sensor opening 122. Electronic components 135 may be coupled to each of these contacts 134 using surface mount technology (SMT). A plurality of lens module connections 126 are provided along the outer edges of the substrate 120 for coupling with corresponding contacts 143 (shown in FIG. 1) in the lens housing 142. These lens module connections 126 may be used to provide power, ground, and control signals to the lens module 126. The various contacts provided on the substrate 120 may be formed, e.g., using electroless nickel immersion gold (ENIG) plating techniques. ENIG is an electroless nickel layer capped with a thin layer of immersion gold, which provides a multifunctional surface finish. The immersion gold protects the underlying nickel from oxidation/passivation.

The stiffener member 160 may comprise any material, such as a metallic, composite, polymer, or laminate, that provides sufficient rigidity to the flexible substrate 120 to provide a substantially rigid substrate assembly 620. The stiffener member 160 may comprise, for example, a sheet of metal having a thickness of approximately 0.15 mm to 0.20 mm. Stainless steel may be desirable as it can be produced with a highly uniform planarity and thickness. In other embodiments, the stiffener member 160 may comprise a laminate, such as a glass-reinforced epoxy laminate sheet, e.g., FR4/FR5. The stiffener member 160 may be coupled to the flexible substrate 120 using, for example, an epoxy, adhesive film, or other adhesive material.

In step 503, the electronic components 135 are coupled to the substrate 120. The upper side 121a of each substrate 120 includes a plurality of component contacts 134 around the periphery of the image sensor opening 122. After the stiffener member 160 is coupled to the flexible substrate 120, a portion of the upper side of the stiffener member 160 is exposed by the image sensor opening 122 and forms a die attach region 123. The electronic components 135 may be coupled to each of these contacts 134 using SMT processes. In the embodiment shown in FIG. 6B, six components 135 are shown. In other embodiments, greater or fewer components 135 may be used.

Figure 6D:
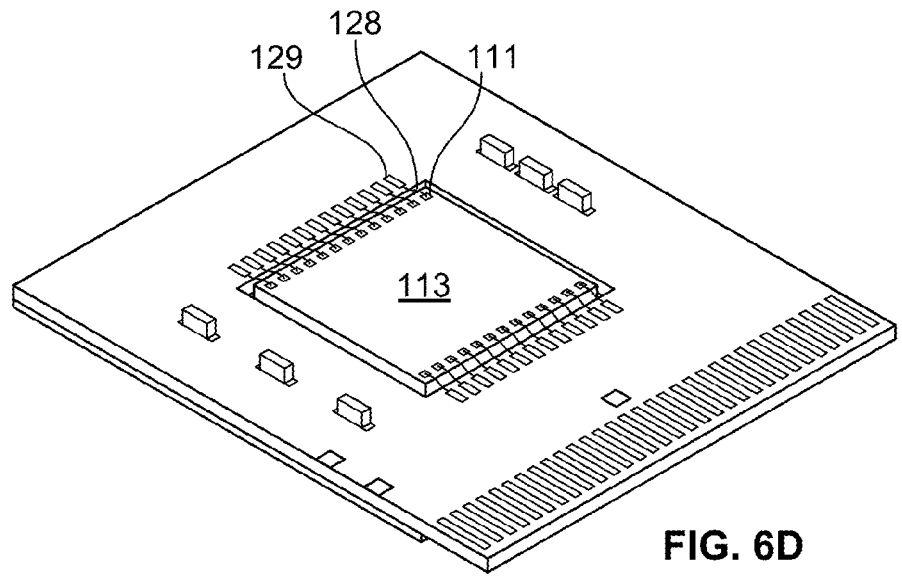
Figure 6E:
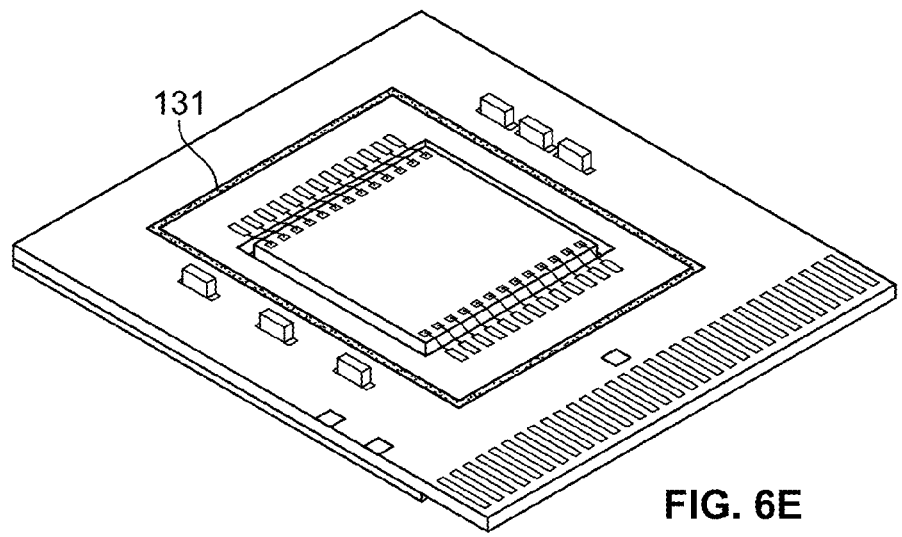

In step 504, shown in FIG. 6D, the image sensor die 110 is attached to the substrate assembly 620, using, for example, an epoxy adhesive. In the illustrated embodiment, the image sensor opening 122 is larger than the image sensor die 110, so the image sensor die 110 is positioned entirely within the image sensor opening 122 and is bonded entirely to the stiffener member 160 without the flexible substrate 120 interposed between the die 110 and the stiffener member 160. By positioning the image sensor die 110 within the opening 122, the overall height of the camera module 100 may be reduced.

In step 505, the die contacts 111 on the upper surface of each image sensor die 110 are wire bonded to substrate-sensor contacts 129 on the upper surface of the flexible substrate 120. Each of the die contacts 111 is coupled to a respective one of the substrate-sensor contacts 129 using a bond wire 128, e.g., a gold bond wire, which extends across the gap separating the flexible substrate 120 and the image sensor die 110.

Next, a spacer member 130 is provided on the upper surface of the flexible substrate 120. The spacer member 130 may comprise any of a variety of structures for supporting the optical filter 112. Steps 506-508 illustrate a method of forming a spacer member 130 in accordance with embodiments of the present invention. In the illustrated embodiment, the spacer member 130 comprises an adhesive layer 131, a frame 132, and a second adhesive layer, which collectively support the optical filter 112 above the surface of the image sensor die 110. In step 506, shown in FIG. 6E, an adhesive 131 is deposited on the flexible substrate 120 surrounding the image sensor opening 122. Any suitable adhesive may be used, such as, for example, an epoxy adhesive 131. The adhesive layer 131 may be deposited at any desired thickness, such as, for example, 0.05 mm.

Figure 6F:
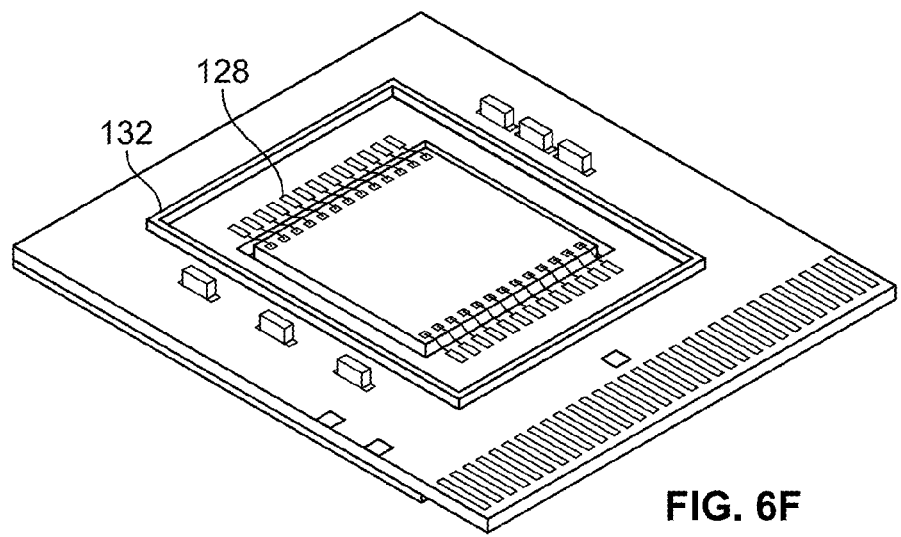

In step 507, shown in FIG. 6F, a frame 132 is attached to the adhesive 131. The frame may comprise any material suitable to support the optical filter 112, such as a metallic (e.g., stainless steel, aluminum, etc.), a composite, a polymer, or a laminate. The frame 132 may have any desired thickness, such as, for example, 0.2 mm. Because the frame 132 is only supporting the optical filter 112, it does not need to have a significant degree of structural strength.

In step 508, a second adhesive layer is deposited on top of the frame 132. Any suitable adhesive, such as an epoxy or other adhesive used for adhesive layer 131, may be used. The second adhesive layer may be deposited at any desired thickness, such as, for example, 0.05 mm.

Figure 6G:
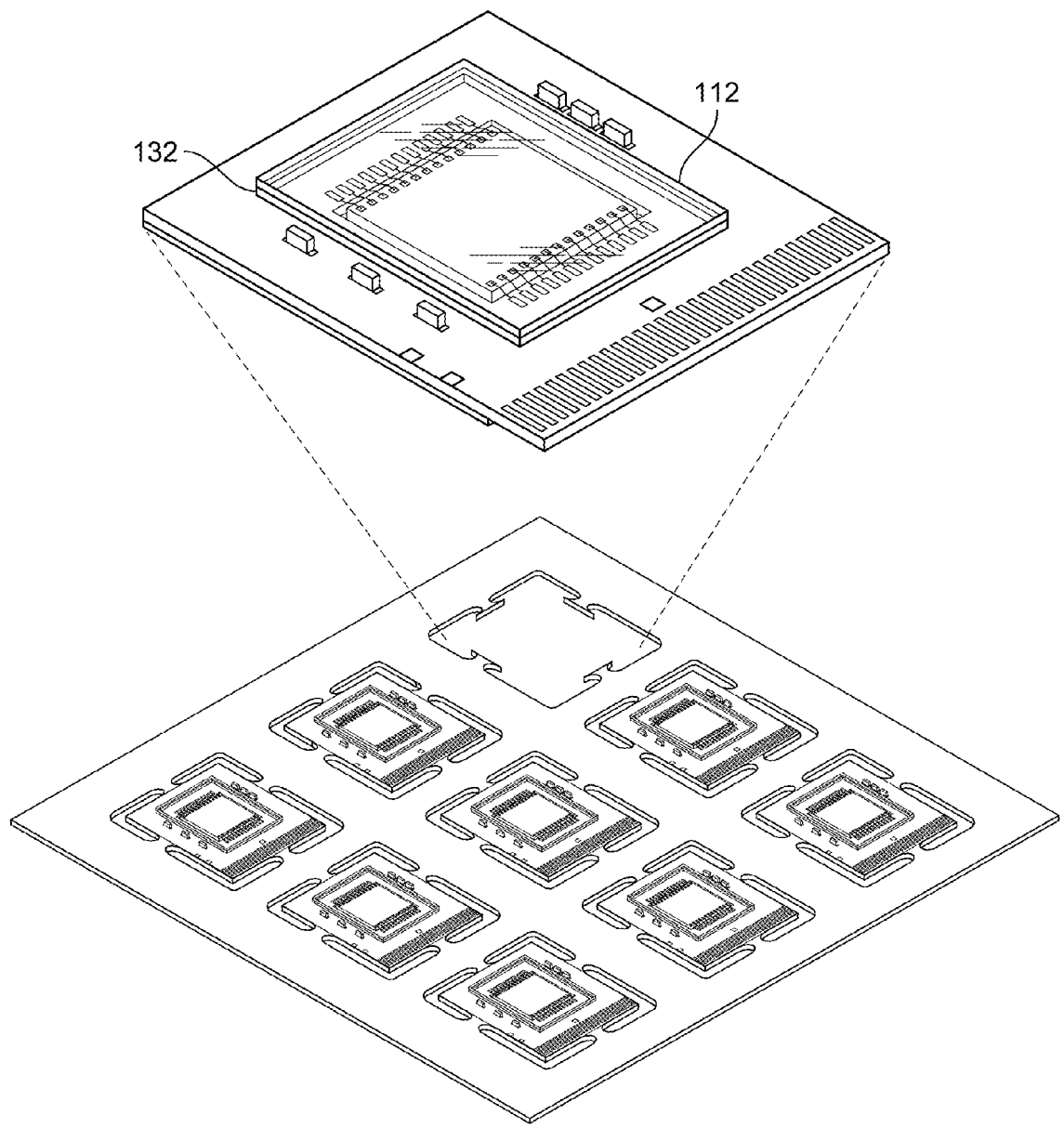

In step 509, shown in FIG. 6G, the optical filter 112 is attached to the second adhesive layer, thereby providing a seal to prevent contaminants or other debris from contacting the photosensor portion 113 of the image sensor die 110. The spacer 130 supports the optical filter 112 at a sufficient height above the image sensor die 110 so that the bond wires 128 do not contact the optical filter 112. This helps to protect the bond wires 128 from any impact that might result in a disconnection of one of the bond wires 128. In some embodiments, the spacer 130, including the adhesive layer 131, frame 132, and second adhesive layer, support the optical filter 112 approximately 0.2 mm above the surface of the image sensor die 110. In other embodiments, the distance between the filter 112 and the die 110 may vary, depending on the desired optical path and space constraints.

Figure 6H:
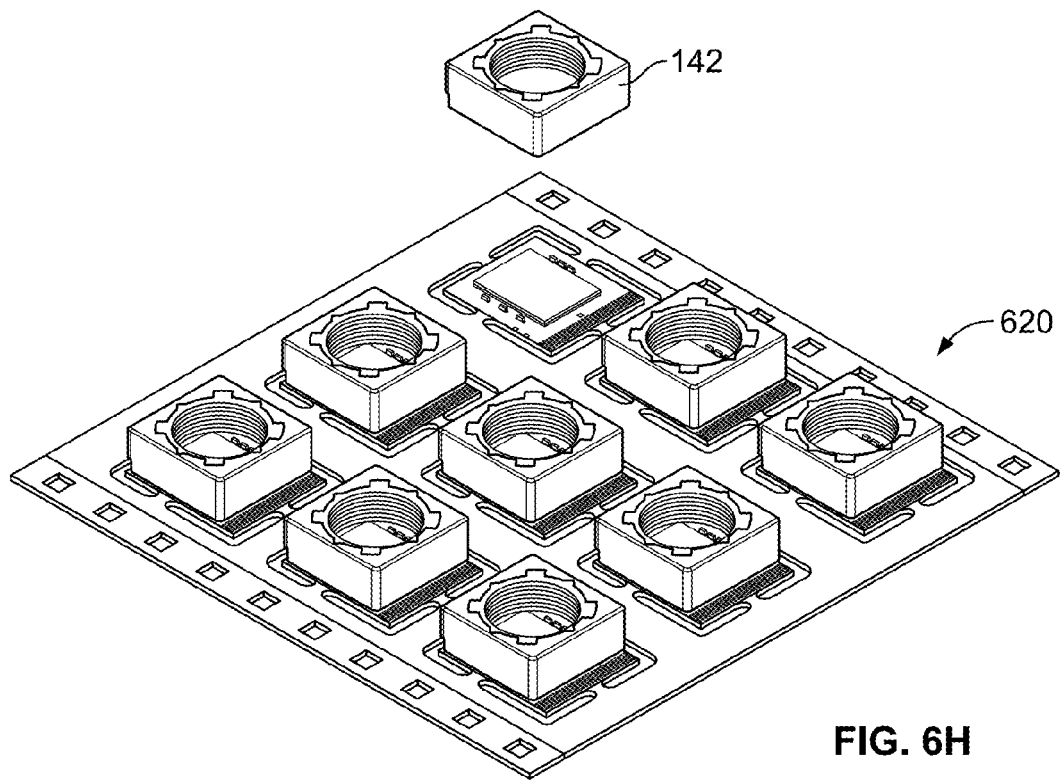

In other embodiments, the spacer 130 may be formed in any way suitable for providing the desired support to the optical filter 112. For example, a low viscosity adhesive, such as an epoxy layer, may be used to form the spacer 130. The epoxy layer may be deposited at a thickness of, for example, 0.1 mm, 0.2 mm, 0.3 mm, on top of the substrate 120. The optical filter 112 may be positioned directly onto the epoxy layer without the use of a rigid frame 132, as shown in FIG. 6H. Once the epoxy layer has cured, it will form a substantially rigid support for the optical filter 112.

In step 510, shown in FIG. 6H, the lens housing 142 is coupled to each of the substrate assemblies 120 in the substrate strip array 620. The lens housing 142 may be attached to the substrate assemblies 120 by depositing an adhesive, such as an epoxy adhesive, onto a portion of the substrate 120 not otherwise used for electrical connections. The lens module connections (not shown) on the substrate 120 may then be coupled to the corresponding contacts (not shown) in the lens housing 142 using, for example, conventional soldering methods.

Figure 6I:
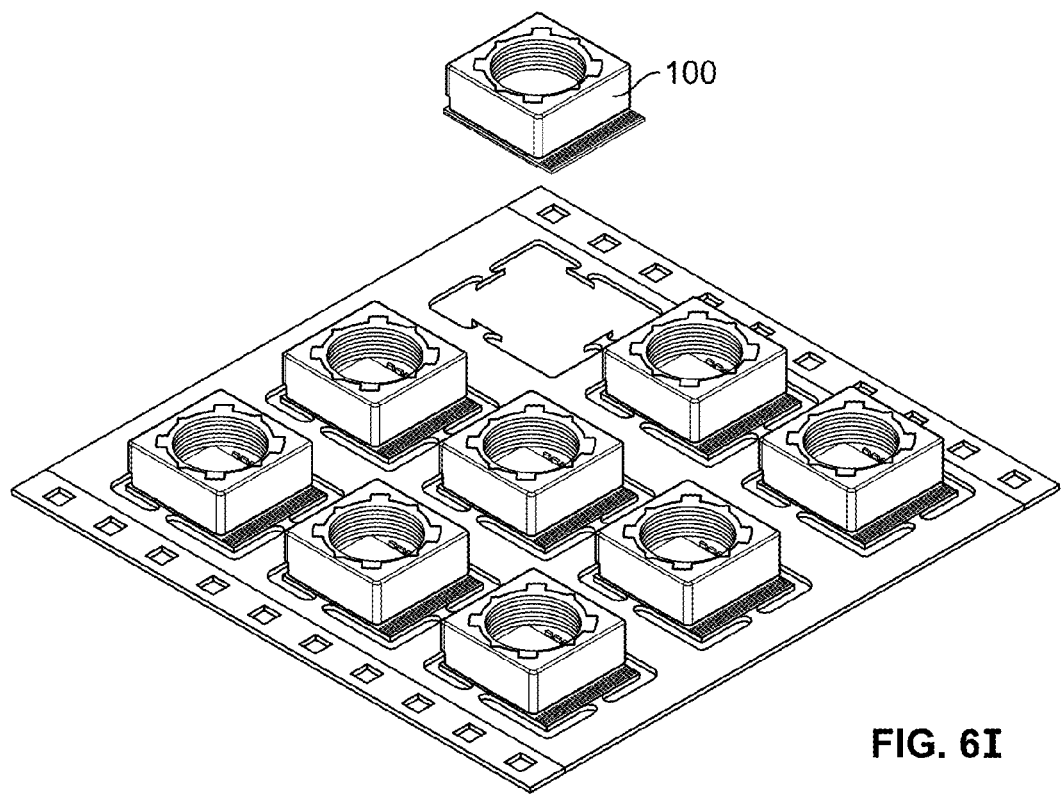

In step 511, shown in FIG. 6I, each camera module 100 may then be singulated from the strip array 620. In some embodiments, the substrate assemblies 120 may be singulated from the strip array 620 prior to attachment of the lens housings 142. However, in other embodiments, it is desirable to attach the lens housings 142 to each of the substrates 120 prior to singulation from the array 620. This bulk processing can result in an improvement in the manufacturing units per hour (UPH). In addition, after the lens housings 142 are attached, the strip array 620 may be coupled to a test fixture which establishes electrical connections with each of the camera modules 100 in the array 620. This can enable the test fixture to power up and test each of the camera modules 100 prior to singulation. During this testing, an active alignment process may be performed to ensure that the optical path through the lenses 145 is accurately aligned with the image sensor die 110. The active alignment process can measure the optical characteristics of the lenses 145 and image sensor die 110 and adjust the alignment in up to five degrees of freedom. By attaching the lens housing 142 and performing the active alignment process prior to singulation, the testing and alignment can be performed in a batch process, thereby improving UPH.

Figure 7A:
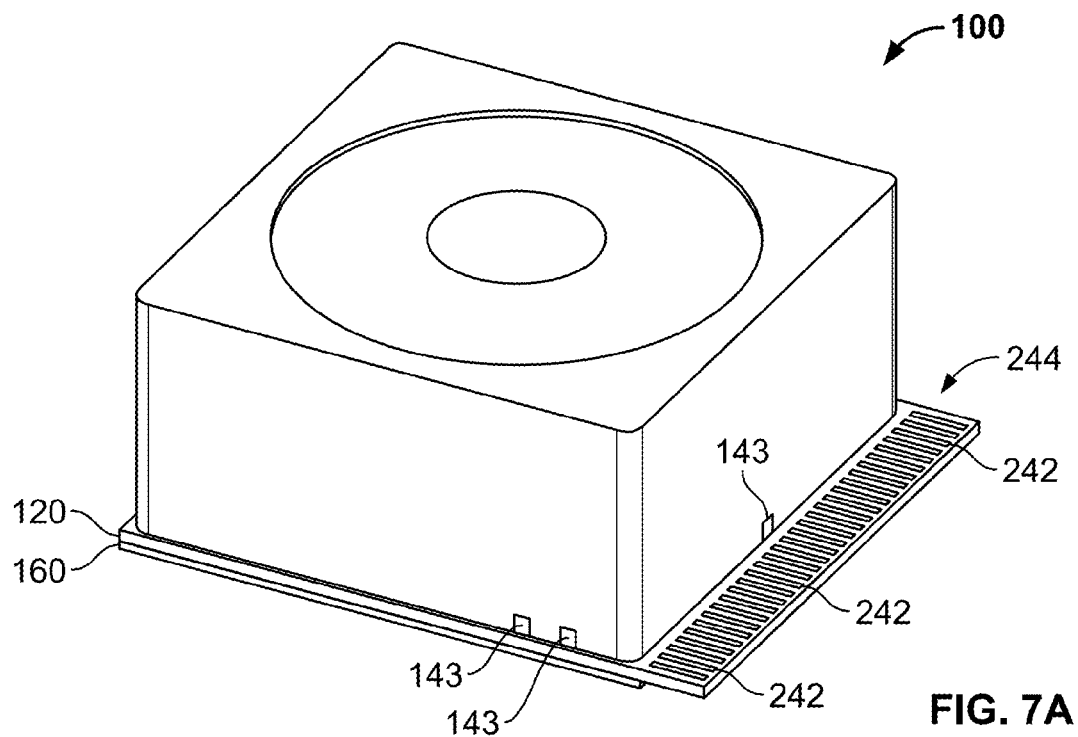
FIGS. 7A-7B illustrate perspective views of a camera module, in accordance with embodiments of the present invention.
Figure 7B:
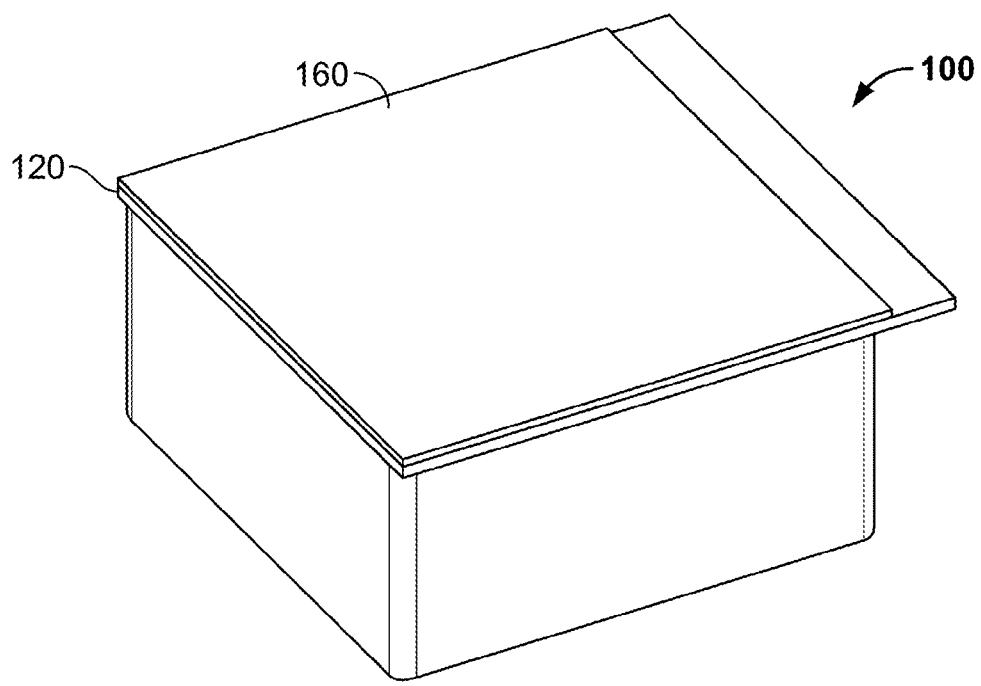

FIGS. 7A-7B show top and bottom perspective views, respectively, of the completed camera module 100.

In step 512, the camera module 100 is coupled to the main board of the electronic device to form a completed camera assembly. This may be accomplished using any of a variety of known methods. As described above, the upper side 121a of the substrate 120 includes a main board contact region 244, which may extend beyond the stiffener member 160, as shown in FIG. 7B. The region directly underneath the extending main board contact region 244 may provide clearance for other components in the device. The main board contact region 244 includes a plurality of LGA pads 242 which may be coupled to main board contacts on the main board of the electronic device. The LGA pads 242 receive all of the power and I/O signals required for operation of the camera module 100. The LGA pads 242 can be bonded (e.g., soldered) directly to corresponding contacts on the main board or to an intermediate interposer structure, such as a cable or circuit board, which is coupled to the main board. It will be understood that in other embodiments, the type, arrangement, and manufacturing steps for the various components of the camera assembly may vary. For example, as illustrated in FIG. 6B, the electronic components 135 are mounted on the substrate 120 along two edges of the image sensor opening 122. In other embodiments, the electronic components 135 may be mounted along one, three, or four edges of the substrate 120, or may be positioned elsewhere in the camera module 100. In addition, the contacts for power and I/O with the main board need not be provided in an LGA fan-out main board contact region 244. These contacts may be formed using any of the contact techniques known by one of ordinary skill in the art.

Camera Module Adapter

Figure 8:
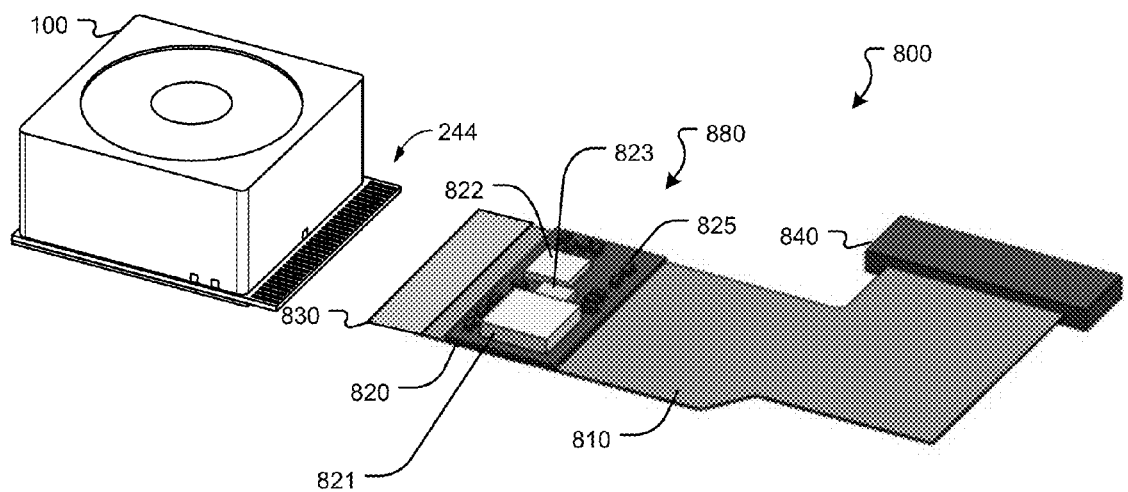
FIG. 8 shows a camera module adapter that may be used in conjunction with a camera module, in accordance with embodiments of the present invention.

FIG. 8 shows a camera module adapter that may be used in conjunction with the camera module 100, in accordance with embodiments of the present invention. As described above, the camera module 100 includes a main board contact region 244 which can be coupled to the main board of an electronic device into which the camera module 100 is integrated. In some embodiments, the camera module 100 may be connected directly to the main board of the device. In other embodiments, an adapter 800 may be used to couple the camera module 100 to the main board. This adapter 800 may include additional electronic components for providing camera functionality.

As shown in FIG. 8, the adapter 800 comprises an adapter body 810, a component region 820, a camera connector region 830, and a main board connector region 840. The adapter body 810 may comprise any of a variety of substrates adapted to carry electrical signals between the camera module 100 and the electronic device. In some embodiments, the adapter body 810 may comprise a flexible tape substrate.

The component region 820 may comprise a portion of the adapter body 810 or may comprise a separate substrate (rigid or flexible) operatively coupled to the adapter body 810. One or more electronic components may be coupled to the component region 820. In some embodiments, the electronic components mounted to the component region 820 may comprise image stabilization components 880 used to provide an optical image stabilization (OIS) functionality for the camera module 100. These image stabilization components 880 may comprise, for example, a gyroscopic sensor 821, a memory 822, an optical image stabilization logic module 823, and passive electronic components 825. The gyroscopic sensor 821 may comprise one or more sensors for sensing movement along one or more axes. In some embodiments, the gyroscopic sensor 821 may sense movement along two axes, thereby enabling correction for pitch and yaw axis rotations. The memory 822 may comprise a non-volatile EPROM memory for storing the firmware instructions for the operation of the OIS functionality. The optical image stabilization logic module 823 may comprise a controller with logic for executing the OIS functionality. The image stabilization components 880 may be mounted to the component region 820 using any suitable manufacturing technique, such as the SMT mounting process described above.

In accordance with some embodiments of the present invention, the electronic components 135 on the substrate 120 comprise decoupling capacitors that are coupled to the substrate 120 along the two sides of the image sensor die 110 not used for wire bonding of the die 110 to the substrate 120. As a result, the decoupling capacitor passive components 135 may be placed as close as possible to the image sensor die 110, thereby improving the image signal from the die 110. Other passive components 825 that do not require close proximity to the image sensor die 110 or that require close proximity to the other image stabilization components 880, such as the gyroscopic sensor 821 and optical image stabilization logic module 823, may be coupled to the component region 820.

The camera connector region 830 comprises a plurality of contacts for electronic coupling with the plurality of LGA pads 242 in the contact region 244 of the camera module 100. The connector region 830 may comprise, for example, an anisotropic conductive film (ACF) or anisotropic conductive adhesive (ACA) for making the connection between the contact region 244 of the camera module 100 and the connector region 830 of the adapter 800.

The main board connector region 840 may comprise any type of connector for coupling with the main board of the electronic device, as would be understood by one of ordinary skill in the art.

The above-described embodiments may achieve a number of advantages over conventional camera module designs. The overall size of the camera module may be reduced. Positioning the image sensor die in the image sensor opening can enable reduction of the overall height of the camera module by eliminating any extra height that may result from attaching the image sensor die directly to the top of the tape substrate. The stiffener member provides sufficient rigidity to maintain structural support for the camera module.

Because HDI tape substrates provide much higher line pitch than conventional laminate substrates, the use of HDI tape substrates can enable a reduction in the number of layers necessary for the interconnect structure of the substrate. Exemplary HDI tape substrates may have, for example, a line pitch of between 16 µm-50 µm.

Flip-chip bonding of a image sensor die utilizes the application of pressure and heat to the back side of the die, which requires that the die be thick enough to withstand the pressure without damage. However, when the image sensor die is wire bonded to the substrate assembly, as described above, pressure and heat need not be applied to the die, thereby enabling a reduction in die thickness.

In addition, the ability to perform numerous steps in the manufacturing process while the substrate assemblies remain in strip array format can enable more efficient batch processing, thereby reducing the cost per unit. Flexible tape substrates may be provided in even larger strips than conventional ceramic and laminate strip arrays, thereby increasing the number of camera modules that may be manufactured in each batch, resulting in an improvement in the manufacturing units per hour (UPH).

The footprint of the camera module (i.e., the width and length) may be minimized as a result of placing the passive components on the upper side of the substrate around the periphery of the image sensor opening and within the cavity of the lens housing.

The use of the adapter 800 may provide numerous advantages as well. Many of the passive components utilized in digital cameras have a relatively high rate of failure. Accordingly, when testing discovers failed passive components after the camera module has been fully assembled, the entire camera module may have to be scrapped. When the failed passive components are provided on a separate adapter 800, only the adapter 800 would need to be replaced, thereby sparing the much more expensive camera module from being scrapped.

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. The various features and processes described above may be used independently of one another, or may be combined in various ways. All possible combinations and subcombinations are intended to fall within the scope of this disclosure.

In addition, conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Although this disclosure has been described in terms of certain example embodiments and applications, other embodiments and applications that are apparent to those of ordinary skill in the art, including embodiments and applications that do not provide all of the benefits described herein, are also within the scope of this disclosure. The scope of the inventions is defined only by the claims, which are intended to be construed without reference to any definitions that may be explicitly or implicitly included in any incorporated-by-reference materials.

What is claimed is:

1. A camera module, comprising:
  a substrate assembly comprising:
    a die attach region;
    a flexible substrate comprising a circuit board contact region for coupling with a circuit board of an electronic device, and a component mounting region, wherein the component mounting region comprises a plurality of component contacts adjacent to the die attach region; and
    a stiffener member coupled to the flexible substrate;
  an image sensor die coupled to the die attach region of the substrate assembly, said image sensor die comprising a plurality of die contacts coupled to the flexible substrate with a plurality of bond wires;
  a plurality of electronic components, each of the plurality of electronic components being coupled to a respective one of the plurality of component contacts;
  a spacer member coupled to the flexible substrate;
  an optical filter coupled to the spacer member, said optical filter positioned at least 0.2 mm above the image sensor die; and
  a lens module comprising a lens housing and at least one lens contained in the lens housing, said lens housing being coupled to the upper side of the substrate assembly.

2. The camera module of claim 1, wherein:
  said spacer member comprises one or more of a rigid frame bonded to the flexible substrate or a solidified low viscosity adhesive deposited on the flexible substrate.

3. The camera module of claim 1, wherein the flexible substrate comprises a high density interconnect (HDI) tape substrate.

4. The camera module of claim 1, wherein:
  said flexible substrate comprises a die mounting opening; and
  said image sensor die is bonded to the stiffener member, wherein at least a portion of the image sensor die is positioned in the die mounting opening.

5. The camera module of claim 1, further comprising:
a camera module adapter comprising a camera connection region coupled to the circuit board contact region of the substrate assembly, said camera module adapter comprising a gyroscopic sensor, an image stabilization logic module, and a main board connector region.

6. A camera assembly, comprising:
a substrate assembly comprising a first side and a second side, said substrate assembly comprising:
a flexible substrate; and
a stiffener member coupled to the flexible substrate;
an image sensor die coupled to the first side of the substrate assembly;
a spacer member coupled to the first side of the substrate assembly;
an optical filter coupled to the spacer member; and
a lens module comprising a lens housing and at least one lens contained in the lens housing, said lens housing being coupled to the first side of the substrate assembly.

7. The camera module of claim 6, wherein:
said image sensor die comprises a plurality of die contacts coupled to the flexible substrate with a plurality of bond wires; and
said spacer member separates the optical filter from the image sensor die such that the plurality of bond wires do not contact the optical filter.

8. The camera assembly of claim 6, wherein the stiffener member comprises one or more of a metal, composite, polymer, or laminate.

9. The camera assembly of claim 6, wherein the flexible substrate comprises one or more of a high density interconnect (HDI) tape substrate or a polyimide tape substrate.

10. The camera assembly of claim 6, wherein:
said flexible substrate comprises an opening; and
said image sensor die is bonded to the stiffener member, wherein at least a portion of the image sensor die is positioned in the opening.

11. The camera assembly of claim 10, wherein an upper surface of the image sensor die is approximately coplanar with an upper surface of the flexible substrate.

12. The camera assembly of claim 6, further comprising a plurality of electronic components, each of the plurality of electronic components being coupled to a respective one of a plurality of component contacts provided on the first side of the substrate assembly.

13. The camera assembly of claim 6, wherein the first side of the substrate assembly further comprises a plurality of land grid array (LGA) pads electrically coupled to the image sensor die.

14. The camera assembly of claim 13, further comprising an interposer coupling the plurality of LGA pads to circuit board contacts on a circuit board for an electronic device, said interposer being attached to the LGA pads with an anisotropic conductive adhesive.

15. The camera assembly of claim 6, further comprising a plurality of lens module contacts formed on the first side of the substrate assembly, wherein each of the plurality of lens module contacts is coupled to respective ones of a plurality of housing contacts provided on the lens housing, one or more of the plurality of lens module contacts delivering power from the substrate assembly to the lens module and one or more of the plurality of lens module contacts delivering control signals from the substrate assembly to the lens module.

16. The camera module of claim 6, further comprising:
a camera module adapter comprising a camera connection region coupled to the substrate assembly, said camera module adapter comprising a gyroscopic sensor, an image stabilization logic module, and a main board connector region.

17. A method of forming a camera assembly, comprising:
forming a substrate assembly by coupling a stiffener member to a flexible substrate;
coupling a plurality of electronic components to a first side of the substrate assembly;
bonding an image sensor die to the first side of the substrate assembly;
coupling a spacer member to the flexible substrate;
coupling an optical filter to the spacer member; and
attaching a lens module to the first side of the substrate assembly.

18. The method of claim 17, further comprising coupling each of a plurality of die contacts on the image sensor die to the first side of the substrate assembly with a plurality of bond wires, wherein said spacer member supports the optical filter at a position separated from the plurality of bond wires.

19. The method of claim 17, further comprising coupling power, ground, and control signal contacts on the lens module with corresponding contacts on the substrate assembly.

20. The method of claim 17, wherein:
said flexible substrate comprises an opening; and
said bonding the image sensor die to the first side of the substrate assembly comprises positioning the image sensor die in the opening of the flexible substrate such that an upper surface of the image sensor die is coplanar with an upper surface of the flexible substrate.

* * * * *